(12) United States Patent
Irie

(10) Patent No.: US 9,045,691 B2
(45) Date of Patent: Jun. 2, 2015

(54) CERAMICS COMPOSITE

(71) Applicant: Masaki Irie, Kanagawa (JP)

(72) Inventor: Masaki Irie, Kanagawa (JP)

(73) Assignee: Covalent Materials Corporation, Tokyo (JP)

( * ) Notice: Subject to any disclaimer, the term of this patent is extended or adjusted under 35 U.S.C. 154(b) by 177 days.

(21) Appl. No.: 13/762,320

(22) Filed: Feb. 7, 2013

(65) Prior Publication Data

US 2013/0256599 A1  Oct. 3, 2013

(30) Foreign Application Priority Data

Mar. 30, 2012 (JP) ................................. 2012-081007
Sep. 26, 2012 (JP) ................................. 2012-211637

(51) Int. Cl.
| | | |
|---|---|---|
| C09K 11/08 | (2006.01) |
| C09K 11/77 | (2006.01) |
| C04B 35/117 | (2006.01) |
| C04B 35/626 | (2006.01) |
| H01L 33/50 | (2010.01) |
| H01L 33/64 | (2010.01) |

(52) U.S. Cl.
CPC ........... *C09K 11/7774* (2013.01); *H01L 33/502* (2013.01); *H01L 33/644* (2013.01); *C04B 35/117* (2013.01); *C04B 35/6261* (2013.01); *C04B 35/62655* (2013.01); *C04B 35/62695* (2013.01); *C04B 2235/3222* (2013.01); *C04B 2235/3224* (2013.01); *C04B 2235/3225* (2013.01); *C04B 2235/3229* (2013.01); *C04B 2235/3286* (2013.01); *C04B 2235/5445* (2013.01); *C04B 2235/6581* (2013.01); *C04B 2235/764* (2013.01); *C04B 2235/80* (2013.01); *C04B 2235/9646* (2013.01); *C04B 2235/9653* (2013.01); *C04B 2235/9661* (2013.01)

(58) Field of Classification Search
CPC ........... C09K 11/7715; C09K 11/7721; C09K 11/7774; C09K 11/7783; C09K 11/7792; H01L 33/502
USPC .................................................. 252/301.4 R
See application file for complete search history.

(56) References Cited

U.S. PATENT DOCUMENTS

| | | | |
|---|---|---|---|
| 2010/0231120 A1* | 9/2010 | Mitani et al. .................. | 313/503 |
| 2013/0088143 A1* | 4/2013 | Ohtsubo et al. ............... | 313/503 |

FOREIGN PATENT DOCUMENTS

| | | | |
|---|---|---|---|
| JP | 2011-012215 A | | 1/2011 |
| JP | 2011-213780 A | | 10/2011 |
| JP | 2011213780 A | * | 10/2011 |
| JP | 2013-56999 A | | 3/2013 |
| WO | WO 2007/083828 A1 | | 7/2007 |
| WO | WO 2007083828 A1 | * | 7/2007 |
| WO | WO 2011125422 A1 | * | 10/2011 |

OTHER PUBLICATIONS

Machine translation of JP 2011-213780, printed Sep. 25, 2014.*
Japanese Office Action dated Oct. 9, 2013 with English translation.

* cited by examiner

*Primary Examiner* — Carol M Koslow
*Assistant Examiner* — Lynne Edmondson
(74) *Attorney, Agent, or Firm* — McGinn IP Law Group, PLLC

(57) ABSTRACT

The present invention relates to a ceramics composite including: a matrix phase including $Al_2O_3$ or a substance in which one selected from $Sc_2O_3$ and $Ga_2O_3$ is incorporated into $Al_2O_3$; a main phosphor phase formed in the matrix phase and including a substance represented by a general formula $A_3B_5O_{12}$:Ce in which A is at least one selected from Y, Gd, Tb, Yb and Lu and B is at least one selected from Al, Ga and Sc; and a $CeAl_{11}O_{18}$ phase mixed in the matrix phase and the main phosphor phase.

7 Claims, 2 Drawing Sheets

US 9,045,691 B2

CERAMICS COMPOSITE

FIELD OF THE INVENTION

The present invention relates to a ceramics composite for wavelength conversion for use in white or color light emitting diode (LED) and the like.

BACKGROUND OF THE INVENTION

LED has been applied to cellular phones, various display devices, and the like owing to characteristics such as electric power saving, long life, and small size. With an improvement of light emission efficiency thereof, LED has been rapidly coming into wide use also in illumination uses.

Currently, in white LED illumination, the mainstream is a method where blue LED and a phosphor emitting a yellow light that is a complementary color of blue are used in combination to obtain a white light. As the phosphor, YAG (yttrium aluminum garnet)-based ceramics have been frequently employed.

For example, Patent Document 1 describes a ceramics composite having a phosphor phase composed of YAG containing Ce and a matrix phase composed of at least one of $Al_2O_3$ and AlN. The ceramics composite obtained from a phosphor as above has a simple constitution but an excellent emission intensity can be obtained.

Patent Document 1: JP-A-2011-12215

SUMMARY OF THE INVENTION

However, in the ceramics composite as described in Patent Document 1, Ce is prone to evaporate during firing at the time of production, variation in emission distribution occurs among portions and production lots, and wavelength conversion becomes inhomogeneous at the time of irradiation with a blue light, so that chromaticity variation occurs in some cases.

The present invention is contrived for solving the aforementioned technical problem, and an object of the invention is to provide a ceramics composite which can achieve homogeneous wavelength conversion of a blue light and suppress the variation in emission distribution, in order to obtain white or color LED which stably emits light without chromaticity variation.

The ceramics composite according to the first embodiment of the invention is a ceramics composite including:

a matrix phase including $Al_2O_3$ or a substance in which one selected from $Sc_2O_3$ and $Ga_2O_3$ is incorporated into $Al_2O_3$;

a main phosphor phase formed in the matrix phase and including a substance represented by a general formula $A_3B_5O_{12}$:Ce in which A is at least one selected from Y, Gd, Tb, Yb and Lu and B is at least one selected from Al, Ga and Sc; and a $CeAl_{11}O_{18}$ phase mixed in the matrix phase and the main phosphor phase.

By such a constitution, the wavelength conversion at the time of irradiation with a blue light can be performed homogeneously and thus the variation in emission distribution can be suppressed.

Moreover, the ceramics composite according to the second embodiment of the invention is ceramics composite including:

a matrix phase including $Al_2O_3$ or a substance in which one selected from $Sc_2O_3$ and $Ga_2O_3$ is incorporated into $Al_2O_3$;

a main phosphor phase formed in the matrix phase and including a substance represented by a general formula $A_3B_5O_{12}$:Ce in which A is at least one selected from Y, Gd, Tb, Yb and Lu and B is at least one selected from Al, Ga and Sc; and a $CeAl_{11}O_{18}$ phase which is mixed only in the main phosphor phase and is present in higher density with a prescribed thickness at an outer peripheral part than at an inner part of the main phosphor phase and which is contained in an amount of 0.5 to 5.0% by volume in a total volume of the ceramics composite.

By such a constitution, the concentration distribution of Ce in the main phosphor phase can be homogeneously maintained due to a minute amount of $CeAl_{11}O_{18}$ phase and thus the variation in emission distribution is efficiently suppressed. Further, an improvement in emission intensity can be also achieved.

The prescribed thickness of the $CeAl_{11}O_{18}$ phase is preferably 0.1 to 1.9 μm.

By such a constitution, the concentration distribution of Ce in the phosphor phase can be homogeneously maintained and thus the variation in emission distribution can be more efficiently suppressed.

The ceramics composite according to the invention can achieve homogeneous wavelength conversion by the phosphor phase at the time of irradiation with a blue light and thus the variation in emission distribution can be suppressed.

Therefore, the ceramics composite according to the invention can produce a stably emitted white light or the like without chromaticity variation by the combination with blue LED.

DETAILED DESCRIPTION OF THE INVENTION

The following will describe the ceramics composite according to the invention in detail with reference to Drawings.

Figure 1:
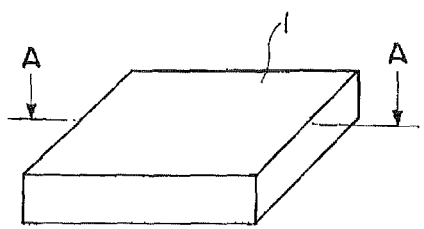
FIG. 1 is a perspective view showing one example of a phosphor as the ceramics composite according to the invention.

FIG. 1 shows one example of an appearance of a phosphor as the ceramics composite according to an embodiment of the invention. An A-A cross-sectional view according to the first embodiment is shown in FIG. 2 and an A-A cross-sectional view according to the second embodiment is shown in FIG. 3.

Figure 2:
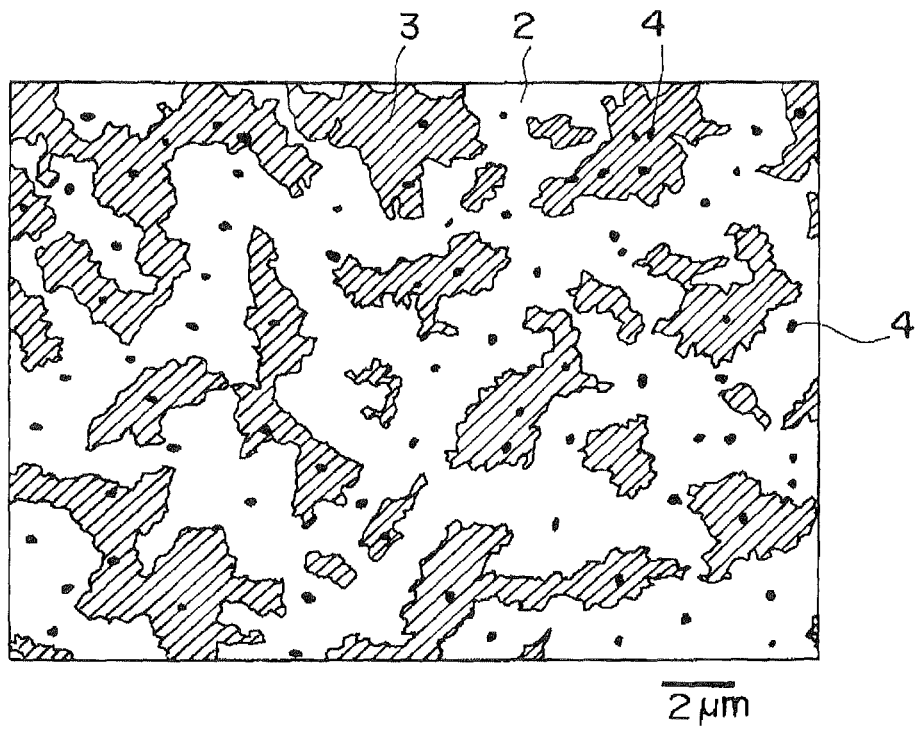
FIG. 2 is an A-A cross-sectional view of the phosphor shown in FIG. 1 according to the first embodiment of the invention.
Figure 3:
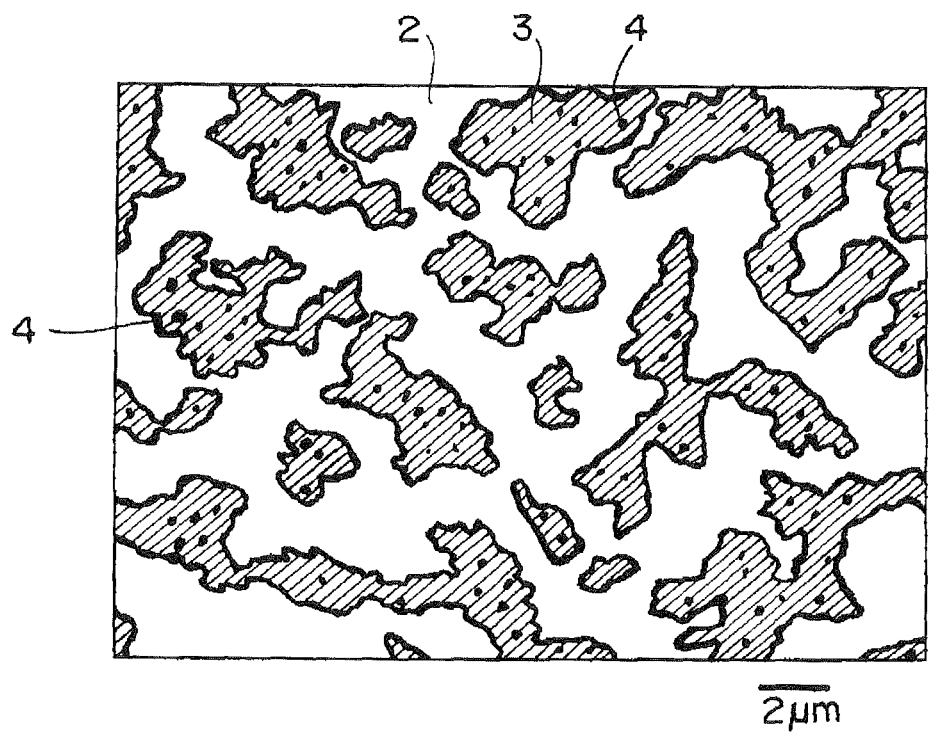
FIG. 3 is an A-A cross-sectional view of the phosphor shown in FIG. 1 according to the second embodiment of the invention.

As shown in FIG. 2, the ceramics composite 1 according to the first embodiment of the invention includes a matrix phase 2 including $Al_2O_3$ or a substance in which one selected from $Sc_2O_3$ and $Ga_2O_3$ is incorporated into $Al_2O_3$; a main phosphor phase 3 formed in the matrix phase 2 and including a substance represented by a general formula $A_3B_5O_{12}$:Ce in which A is at least one selected fro Y, Gd, Tb, Yb and Lu and B is at least one selected from Al, Ga and Sc; and a $CeAl_{11}O_{18}$ phase 4 mixed in the matrix phase 2 and the main phosphor phase 3.

The matrix phase 2 of the ceramics composite includes $Al_2O_3$ or a substance in which one selected from $Sc_2O_3$ and $Ga_2O_3$ is incorporated into $Al_2O_3$.

Since $Al_2O_3$ ceramics or ceramics in which one selected from $Sc_2O_3$ and $Ga_2O_3$ is incorporated into $Al_2O_3$ ceramics are excellent in heat resistance, weather resistance, and heat radiation as well as excellent in translucency, the main phosphor phase 3 can be suitably mixed in the matrix phase 2 and the ceramics can transmit a light emitted from the main phosphor phase 3 and further are suitable materials also from the viewpoint of durability.

The main phosphor phase 3 includes a substance represented by the general formula $A_3B_5O_{12}$:Ce in which A is at least one selected from Y, Gd, Tb, Yb and Lu and B is at least one selected from Al, Ga and Sc.

As above, the ceramics composite according to the invention includes the main phosphor phase 3 using Ce as an activator and Ce is prone to evaporate upon firing at the time of production, whereby the chromaticity variation occurs among the portions and production lots of the ceramics composite.

For solving the above problem, in the ceramics composite according to the invention, for example, the $CeAl_{11}O_{18}$ phase 4 is mixed in the matrix phase 2 and the main phosphor phase 3 in the embodiment as shown in FIG. 2.

By such a constitution, the evaporated amount of Ce in the main phosphor phase can be compensated by Ce in the mixed $CeAl_{11}O_{18}$ phase, so that it is considered that the concentration distribution of Ce in the main phosphor phase 3 can be homogeneously maintained and thus the variation in emission distribution is suppressed.

Moreover, in the ceramics composite 1 according to the second embodiment of the invention, the matrix phase 2 and the main phosphor phase 3 have the same constitutions as those in the ceramics composite according to the first embodiment, respectively, but, as shown in FIG. 3, the $CeAl_{11}O_{18}$ phase 4 is mixed only in the main phosphor phase 3 and is present in higher density with a prescribed thickness at an outer peripheral part than at an inner part of the main phosphor phase 3.

As above, the $CeAl_{11}O_{18}$ phase 4 is present in higher density with a prescribed thickness at an outer peripheral part than at an inner part of the main phosphor phase 3, so that the concentration distribution of Ce in the main phosphor phase 3 can be further homogeneously maintained owing to a minute amount of the $CeAl_{11}O_{18}$ phase 4 and thus the variation in emission distribution can be further suppressed.

In the ceramics composite according to the first embodiment, the $CeAl_{11}O_{18}$ phase 4 is preferably contained in an amount of 0.5 to 5.0% by volume in the total volume of the ceramics composite. Additionally, In ceramics composite according to the second embodiment, the $CeAl_{11}O_{18}$ phase 4 is contained in an amount of 0.5 to 5.0% by volume in the total volume of the ceramics composite.

In the case where the volume is less than 0.5% by volume, portions where Ce evaporated upon firing is not compensated are frequently generated and the chromaticity variation is not sufficiently suppressed.

On the other hand, in the case where the volume exceeds 5.0% by volume, the $CeAl_{11}O_{18}$ phase 4 absorbs fluorescence and thus the emission efficiency decreases.

Incidentally, the volume of the $CeAl_{11}O_{18}$ phase is determined by analyzing the composition of arbitrary cross-section of the ceramics composite on an electron probe microanalyzer (EPMA), calculating concentration distributions of Ce, Al, A (at least one selected from Y, Gd, Tb, Yb and Lu) and B (at least one selected from Al, Ga and Sc), and calculating the ratio of the $CeAl_{11}O_{18}$ phase 4.

The $CeAl_{11}O_{18}$ phase 4 is preferably contained in an amount of 0.5 to 1.2% by volume in the total volume of the ceramics composite.

By controlling the volume to such a range, the emission intensity is improved and further, the variation in emission distribution can be further suppressed.

The thickness of the $CeAl_{11}O_{18}$ phase 4 is preferably 0.1 to 1.9 μm.

When the phase has such thickness, Ce can be more effectively compensated by a minute amount of the $CeAl_{11}O_{18}$ phase and the concentration distribution of Ce in the main phosphor phase 3 can be homogeneously maintained, so that a high efficiency can be kept and the variation in emission distribution can be more effectively suppressed.

In the case where the thickness is less than 0.1 μm, there is a concern that a portion where Ce is not present in high density is generated at an outer peripheral part of the main phosphor phase 3.

On the other hand, in the case where the thickness exceeds 1.9 μm, the $CeAl_{11}O_{18}$ phase 4 absorbs fluorescence and there is a concern that the emission efficiency decreases, so that the concentration distribution of Ce in the main phosphor phase 3 cannot be homogeneously maintained and thus there is a concern that the variation of emission distribution becomes worse.

In this regard, the thickness is determined by composition analysis on EPMA and calculation with specifying the $CeAl_{11}O_{18}$ phase 4.

Incidentally, the content ratio of Ce, which is an activator on the main phosphor phase 3, to A represented by the general formula $A_3B_5O_{12}$:Ce (A is at least one selected from Y, Gd, Tb, Yb and Lu and B is at least one selected from Al, Ga and Sc) is preferably 0.001 to 0.05 in terms of an atomic ratio.

When the content ratio of Ce is controlled to a value within the above range, fluorescence having a suitable wavelength is generated by irradiation with a blue light and an emission color such as practical white color can be obtained.

In the case where the content ratio of Ce is less than 0.001, a sufficient $CeAl_{11}O_{18}$ phase cannot be formed and there is a concern that variation occurs in the emission distribution.

On the other hand, when the content ratio of Ce exceeds 0.05, the $CeAl_{11}O_{18}$ phase is excessively formed and there is a concern that the emission intensity decreases.

The linear transmittance at 600 nm of the ceramics composite is preferably 0.5% or more and less than 5.0%.

In the case where the linear transmittance is less than 0.5%, the ratio of a light extracted from the light outgoing surface side decreases, so that there is a concern that the emission intensity decreases.

On the other hand, in the case where the linear transmittance is 5.0% or more, diffusion of a blue light radiated from the light emitting element becomes insufficient, so that the blue light and the yellow light are separated and there is a concern that the variation in emission distribution occurs.

The linear transmittance of the ceramics composite for use in the same light emitting element at 600 nm is preferably ±0.2% or less.

By such a constitution, a balance between a blue transmitted light and a yellow fluorescent can be homogenized, so that the chromaticity variation can be further decreased.

In the case where the linear transmittance is larger than ±0.2%, a diffusion degree of the blue light varies among portions, so that there is a concern that the chromaticity variation occurs.

EXAMPLES

The following will describe the invention in further detail based on Examples but the invention should not be construed as being limited to the following Examples.

[Test 1]
(Preparation of Ceramics Composite According to First Embodiment)

A $CeO_2$ powder (average particle size of 0.3 μm, purity of 99.9%), a $Y_2O_3$ powder (average particle size of 0.9 μm, purity of 99.9%), an $Al_2O_3$ powder (average particle size of 0.3 μm, purity of 99.9%) were used as raw materials.

First, the $CeO_2$ powder, the $Y_2O_3$ powder, and the $Al_2O_3$ powder were mixed in a prescribed ratio and ethanol and an acrylic binder were added thereto. Then, the whole was mixed in a ball mill using alumina balls for 20 hours to prepare a slurry. From the slurry, a granulation powder having an average particle size of 20 μm was prepared using a spray drier (Preparation 1).

Then, ethanol and an acrylic binder were added only to the $Al_2O_3$ powder and the whole was mixed in a ball mill using alumina balls for 20 hours to prepare a slurry. From the slurry, a granulation powder having an average particle size of 50 μm was prepared using a spray drier (Preparation 2).

After two kinds of the prepared granulation powders were dry mixed, the resulting mixture was subjected to uniaxial molding at 10 MPa and subsequently to cold isostatic press (CIP) at 100 MPa to form a formed article. After degreased at 600° C. in the air, the resulting formed article was fired under a vacuum atmosphere to prepare a ceramics composite.

On this occasion, by changing the amounts of the $CeO_2$ powder, the $Al_2O_3$ powder powder, and the $Y_2O_3$ powder, a plurality of ceramics composites each having a changed volume ratio of $CeAl_{11}O_{18}$ were prepared.

Moreover, a plurality of ceramics composites each being different in the composition and having a changed volume ratio of $CeAl_{11}O_{18}$ were prepared in the same manner except that at least one selected from a $Gd_2O_3$ powder (average particle size of 0.3 μm, purity of 99.9%), a $Tb_2O_3$ powder (average particle size of 0.3 μm, purity of 99.9%), a $Yb_2O_3$ powder (average particle size of 0.3 μm, purity of 99.9%) and a $Lu_2O_3$ powder (average particle size of 0.3 μm, purity of 99.9%) or at least one selected from a $Ga_2O_3$ powder (average particle size of 0.3 μm, purity of 99.9%) and an $Sc_2O_3$ powder (average particle size of 0.3 μm, purity of 99.9%) was further mixed in a prescribed ratio at Preparation 1, or one selected from an $Sc_2O_3$ powder (average particle size of 0.3 μm, purity of 99.9%) and a $Ga_2O_3$ powder (average particle size of 0.3 μm, purity of 99.9%) was further mixed in a prescribed ratio at Preparation 2.

For the prepared ceramics composites, various kinds of evaluations shown in the following were performed.
(Evaluation of Physical Properties and Optical Properties of Ceramics Composite)
(1) Volume Composition After a crystal phase of the ceramics composite was investigated by powder X-ray diffraction, a cross-section was polished and was subjected to composition analysis on EPMA.

Moreover, for the sample under the same conditions as in the above (1), evaluation shown in the following (2) to (5) was performed.
(2) Emission Intensity For a sample processed into a size of 7.5 mm×7.5 mm×0.1 mm in thickness, after an emitted light when blue LED having a peak wavelength of 473 nm was used as an excitation light was collected at an integrating sphere, a spectrum was measured using a spectroscope (USB4000 fiber multi-channel spectroscope manufactured by Ocean Optics, Inc.) and the emission intensity normalized with an absorption amount was determined from the resulting spectrum.
(3) Color Unevenness A sample processed into a size of 1 mm×1 mm×0.08 mm was fixed onto an blue LED element (emission region: 1 mm×1 mm, emission wavelength: 460 nm) with a silicone resin to thereby mount the sample on the blue LED and the color unevenness of an emitted light from a lateral side of the LED element was observed.
(4) Chromaticity Variation For a sample processed into a size of 60 mm×60 mm×0.08 mm in thickness, a blue light having a diameter of 1 mm was applied from a lower part of the sample and an illuminometer (T-10M manufactured by Konica Minolta Holdings, Inc.) was provided on an upper part. Chromaticity was measured at 5 mm intervals (121 points in total) in a region of 50 mm×50 mm at a center of the sample and the chromaticity variation ($\Delta CIE_x$) was evaluated.
(5) Heat Conductivity For a sample processed into a size of 10 mm in diameter×2 mm in thickness, the heat conductivity was measured by laser flash method.

In Tables 1 and 2, test conditions ((1) volume composition) and test results ((2) emission intensity, (4) chromaticity variation) in Test 1 are shown.

TABLE 1

| | Constitution | | | Effect | | | |
| --- | --- | --- | --- | --- | --- | --- | --- |
| | Matrix phase | Main phosphor phase | Volume ratio of $CeAl_{11}O_{18}$ phase (% by volume) | Emission intensity | Chromaticity variation ($\Delta CEX$) | Average value of emission intensity | Average value of chromaticity variation |
| Comparative Example 1 | $Al_2O_3$, $Sc_2O_3$ | $Lu_3Sc_2Al_3O_{12}$:Ce | 5.1 | 90 | 0.0018 | 91.7 | 0.00171 |
| Comparative Example 2 | $Al_2O_3$ | $Y_3Al_5O_{12}$:Ce | 5.2 | 96 | 0.0014 | | |
| Comparative Example 3 | $Al_2O_3$, $Ga_2O_3$ | $Tb_3Ga_1Al_4O_{12}$:Ce | 5.2 | 97 | 0.0018 | | |
| Comparative Example 4 | $Al_2O_3$, $Ga_2O_3$ | $Y_3Ga_1Al_4O_{12}$:Ce | 5.2 | 93 | 0.0019 | | |
| Comparative Example 5 | $Al_2O_3$, $Sc_2O_3$ | $Lu_3Sc_1Al_4O_{12}$:Ce | 5.2 | 94 | 0.0017 | | |
| Comparative Example 6 | $Al_2O_3$ | $Yb_3Al_5O_{12}$:Ce | 5.3 | 90 | 0.0011 | | |
| Comparative Example 7 | $Al_2O_3$ | $Y_{0.5}Gd_{2.5}Al_5O_{12}$:Ce | 5.3 | 95 | 0.002 | | |
| Comparative Example 8 | $Al_2O_3$, $Ga_2O_3$ | $Yb_3Ga_1Al_4O_{12}$:Ce | 5.6 | 95 | 0.0022 | | |
| Comparative Example 9 | $Al_2O_3$ | $Y_{1.5}Gd_{1.5}Al_5O_{12}$:Ce | 5.8 | 93 | 0.0017 | | |
| Comparative Example 10 | $Al_2O_3$, $Sc_2O_3$ | $Y_3Sc_1Al_4O_{12}$:Ce | 5.8 | 89 | 0.0011 | | |
| Comparative Example 11 | $Al_2O_3$, $Ga_2O_3$ | $Gd_3Ga_1Al_4O_{12}$:Ce | 5.9 | 92 | 0.0011 | | |
| Comparative Example 12 | $Al_2O_3$, $Ga_2O_3$ | $Lu_3Ga_1Al_4O_{12}$:Ce | 6.2 | 91 | 0.0024 | | |
| Comparative Example 13 | $Al_2O_3$, $Sc_2O_3$ | $Y_3Sc_2Al_3O_{12}$:Ce | 6.4 | 88 | 0.0021 | | |
| Comparative Example 14 | $Al_2O_3$ | $Tb_3Al_5O_{12}$:Ce | 6.5 | 92 | 0.0013 | | |
| Comparative Example 15 | $Al_2O_3$ | $Lu_3Al_5O_{12}$:Ce | 7.3 | 80 | 0.0021 | | |
| Example 1 | $Al_2O_3$ | $Yb_3Al_5O_{12}$:Ce | 5 | 101 | 0.0012 | 102.1 | 0.00176 |
| Example 2 | $Al_2O_3$ | $Y_{1.5}Gd_{1.5}Al_5O_{12}$:Ce | 5 | 103 | 0.0013 | | |

TABLE 1-continued

| | Constitution | | | Effect | | | |
|---|---|---|---|---|---|---|---|
| | Matrix phase | Main phosphor phase | Volume ratio of $CeAl_{11}O_{18}$ phase (% by volume) | Emission intensity | Chromaticity variation ($\Delta CEX$) | Average value of emission intensity | Average value of chromaticity variation |
| Example 3 | $Al_2O_3$ | $Y_3Al_5O_{12}$:Ce | 5 | 101 | 0.0015 | | |
| Example 4 | $Al_2O_3$ | $Tb_3Al_5O_{12}$:Ce | 5 | 103 | 0.0017 | | |
| Example 5 | $Al_2O_3$ | $Y_{0.5}Gd_{2.5}Al_5O_{12}$:Ce | 5 | 102 | 0.0021 | | |
| Example 6 | $Al_2O_3$ | $Lu_3Al_5O_{12}$:Ce | 5 | 100 | 0.0022 | | |
| Example 7 | $Al_2O_3, Ga_2O_3$ | $Gd_3Ga_1Al_4O_{12}$:Ce | 5 | 104 | 0.0013 | | |
| Example 8 | $Al_2O_3, Ga_2O_3$ | $Y_3Ga_1Al_4O_{12}$:Ce | 5 | 102 | 0.0017 | | |
| Example 9 | $Al_2O_3, Ga_2O_3$ | $Tb_3Ga_1Al_4O_{12}$:Ce | 5 | 102 | 0.0017 | | |
| Example 10 | $Al_2O_3, Ga_2O_3$ | $Lu_3Ga_1Al_4O_{12}$:Ce | 5 | 102 | 0.002 | | |
| Example 11 | $Al_2O_3, Ga_2O_3$ | $Yb_3Ga_1Al_4O_{12}$:Ce | 5 | 101 | 0.0021 | | |
| Example 12 | $Al_2O_3, Sc_2O_3$ | $Y_3Sc_1Al_4O_{12}$:Ce | 5 | 106 | 0.0015 | | |
| Example 13 | $Al_2O_3, Sc_2O_3$ | $Lu_3Sc_1Al_4O_{12}$:Ce | 5 | 101 | 0.0018 | | |
| Example 14 | $Al_2O_3, Sc_2O_3$ | $Lu_3Sc_2Al_3O_{12}$:Ce | 5 | 103 | 0.0019 | | |
| Example 15 | $Al_2O_3, Sc_2O_3$ | $Y_3Sc_2Al_3O_{12}$:Ce | 5 | 100 | 0.0024 | | |

TABLE 2

| | Constitution | | | Effect | | | |
|---|---|---|---|---|---|---|---|
| | Matrix phase | Main phosphor phase | Volume ratio of $CeAl_{11}O_{18}$ phase (% by volume) | Emission intensity | Chromaticity variation ($\Delta CEX$) | Average value of emission intensity | Average value of chromaticity variation |
| Example 16 | $Al_2O_3, Sc_2O_3$ | $Y_3Sc_1Al_4O_{12}$:Ce | 1.2 | 121 | 0.0013 | 111.9 | 0.00165 |
| Example 17 | $Al_2O_3, Sc_2O_3$ | $Lu_3Sc_1Al_4O_{12}$:Ce | 1.2 | 118 | 0.0021 | | |
| Example 18 | $Al_2O_3, Sc_2O_3$ | $Y_3Sc_2Al_3O_{12}$:Ce | 1.1 | 120 | 0.0015 | | |
| Example 19 | $Al_2O_3, Ga_2O_3$ | $Gd_3GA_1Al_4O_{12}$:Ce | 1.1 | 108 | 0.0021 | | |
| Example 20 | $Al_2O_3$ | $Tb_3Al_5O_{12}$:Ce | 0.9 | 109 | 0.0014 | | |
| Example 21 | $Al_2O_3$ | $Y_{0.5}Gd_{2.5}Al_5O_{12}$:Ce | 0.8 | 110 | 0.0016 | | |
| Example 22 | $Al_2O_3, Ga_2O_3$ | $Lu_3Ga_1Al_4O_{12}$:Ce | 0.8 | 105 | 0.0021 | | |
| Example 23 | $Al_2O_3, Ga_2O_3$ | $Y_3GA_1Al_4O_{12}$:Ce | 0.7 | 109 | 0.0014 | | |
| Example 24 | $Al_2O_3$ | $Y_{1.5}Gd_{1.5}Al_5O_{12}$:Ce | 0.7 | 109 | 0.0016 | | |
| Example 25 | $Al_2O_3, Ga_2O_3$ | $Yb_3GA_1Al_4O_{12}$:Ce | 0.6 | 104 | 0.0013 | | |
| Example 26 | $Al_2O_3$ | $Lu_3Al_5O_{12}$:Ce | 0.6 | 125 | 0.0015 | | |
| Example 27 | $Al_2O_3, Sc_2O_3$ | $Lu_3Sc_2Al_3O_{12}$:Ce | 0.6 | 119 | 0.002 | | |
| Example 28 | $Al_2O_3$ | $Y_3Al_5O_{12}$:Ce | 0.5 | 110 | 0.0015 | | |
| Example 29 | $Al_2O_3, Ga_2O_3$ | $Tb_3Ga_1Al_4O_{12}$:Ce | 0.5 | 102 | 0.0016 | | |
| Example 30 | $Al_2O_3$ | $Yb_3Al_5O_{12}$:Ce | 0.5 | 110 | 0.0017 | | |
| Comparative Example 16 | $Al_2O_3$ | $Y_{0.5}Gd_{2.5}Al_5O_{12}$:Ce | 0 | 111 | 0.012 | 113.2 | 0.01847 |
| Comparative Example 17 | $Al_2O_3$ | $Yb_3Al_5O_{12}$:Ce | 0 | 112 | 0.012 | | |
| Comparative Example 18 | $Al_2O_3$ | $Y_{1.5}Gd_{1.5}Al_5O_{12}$:Ce | 0 | 112 | 0.015 | | |
| Comparative Example 19 | $Al_2O_3$ | $Tb_3Al_5O_{12}$:Ce | 0 | 112 | 0.015 | | |
| Comparative Example 20 | $Al_2O_3$ | $Y_3Al_5O_{12}$:Ce | 0 | 113 | 0.015 | | |
| Comparative Example 21 | $Al_2O_3$ | $Lu_3Al_5O_{12}$:Ce | 0 | 123 | 0.021 | | |
| Comparative Example 22 | $Al_2O_3, Ga_2O_3$ | $Tb_3Ga_1Al_4O_{12}$:Ce | 0 | 104 | 0.012 | | |
| Comparative Example 23 | $Al_2O_3, Ga_2O_3$ | $Gd_3Ga_1Al_4O_{12}$:Ce | 0 | 108 | 0.014 | | |
| Comparative Example 24 | $Al_2O_3, Ga_2O_3$ | $Y_3Ga_1Al_4O_{12}$:Ce | 0 | 110 | 0.014 | | |
| Comparative Example 25 | $Al_2O_3, Ga_2O_3$ | $Yb_3Ga_1Al_4O_{12}$:Ce | 0 | 105 | 0.021 | | |
| Comparative Example 26 | $Al_2O_3, Ga_2O_3$ | $Lu_3Ga_1Al_4O_{12}$:Ce | 0 | 103 | 0.026 | | |
| Comparative Example 27 | $Al_2O_3, Sc_2O_3$ | $Lu_3Sc_2Al_3O_{12}$:Ce | 0 | 120 | 0.021 | | |
| Comparative Example 28 | $Al_2O_3, Sc_2O_3$ | $Y_3Sc_2Al_3O_{12}$:Ce | 0 | 121 | 0.023 | | |
| Comparative Example 29 | $Al_2O_3, Sc_2O_3$ | $Lu_3Sc_1Al_4O_{12}$:Ce | 0 | 119 | 0.026 | | |
| Comparative Example 30 | $Al_2O_3, Sc_2O_3$ | $Y_3Sc_1Al_4O_{12}$:Ce | 0 | 125 | 0.03 | | |

Incidentally, in (1) volume composition, as a result of calculating the volume ratio of $Y_3Al_5O_{12}$:Ce that is a main phosphor phase, the volume ratio of $Al_2O_3$ that is a matrix phase, and the volume ratio of the $CeAl_{11}O_{18}$ phase in the ceramics composite, it was confirmed that the main phosphor phase is mixed in a ratio of 20% by volume to 25% by volume and the $CeAl_{11}O_{18}$ phase is mixed in the matrix phase and the main phosphor phase.

As shown in Table 1, it is recognized that the chromaticity variation ($\Delta CIE_x$) decreases to 1/10 or less in the case where the volume ratio of the $CeAl_{11}O_{18}$ phase exceeds 0.5% by volume (Examples 1 to 30, Comparative Examples 1 to 15) as compared with the case where the volume ratio of the $CeAl_{11}O_{18}$ phase is 0% by volume (Comparative Examples 16 to 30). Incidentally, in the case where the volume ratio of the $CeAl_{11}O_{18}$ phase exceeds 5% by volume (Comparative Examples 1 to 15), it is recognized that the emission intensity tends to decrease.

Furthermore, in the case where the volume ratio of the $CeAl_{11}O_{18}$ phase is 0.5 to 1.2% by volume (Examples 16 to 30), it is recognized that the emission intensity is improved and further the chromaticity variation ($\Delta CIE_x$) also decreases as compared with the case where the volume ratio is 5% by volume (Examples 1 to 15).

Incidentally, with regard to (3) color unevenness, as compared with a commercially available YAG:Ce phosphor (P46-Y3 manufactured by Chemical Optronics), it is recognized that the color unevenness is small under all conditions. Moreover, with regard to (5) heat conductivity, as a result of evaluation targeting 18 W/(m·K) or more from the viewpoint of a heat radiation effect, it is recognized that the heat conductivity is as high as 24 W/(m·K) under all conditions.

[Test 2]
(Preparation of Ceramics Composite According to Second Embodiment)

A $CeO_2$ powder (average particle size of 0.3 μm, purity of 99.9%), a $Y_2O_3$ powder (average particle size of 0.9 μm, purity of 99.9%), and an $Al_2O_3$ powder (average particle size of 0.3 μm, purity of 99.9%) were used as raw materials.

First, individual raw material powders were mixed in a prescribed ratio, ethanol was added thereto, and the whole was mixed in a ball mill using alumina balls for 20 hours to prepare a slurry. From the slurry, a granulation powder having an average particle size of 20 μm was prepared using a spray drier (Preparation 3).

The prepared granulation powder was fired at 1700° C. in the air to obtain a $Y_3Al_5O_{12}$:Ce powder containing $CeAl_{11}O_{18}$.

Then, ethanol and an acrylic binder were added to the obtained $Y_3Al_5O_{12}$:Ce powder containing $CeAl_{11}O_{18}$ and the $Al_2O_3$ powder and the whole was mixed in a ball mill using alumina balls for 20 hours to prepare a slurry. From the slurry, a granulation powder having an average particle size of 50 μm was prepared using a spray drier.

The granulation powder was subjected to uniaxial molding at 10 MPa and then cold isostatic press (CIP) at 100 MPa to form a formed article. After degreased at 600° C. in the air, the resulting formed article was fired under a vacuum atmosphere to prepare a ceramics composite. Moreover, a plurality of ceramics composites each being different in the composition and having a changed volume ratio of $CeAl_{11}O_{18}$ were prepared in the same manner except that at least one selected from a $Gd_2O_3$ powder (average particle size of 0.3 μm, purity of 99.9%), a $Tb_2O_3$ powder (average particle size of 0.3 μm, purity of 99.9%), a $Yb_2O_3$ powder (average particle size of 0.3 μm, purity of 99.9%), and a $Lu_2O_3$ powder (average particle size of 0.3 μm, purity of 99.9%) or at least one selected from a $Ga_2O_3$ powder (average particle size of 0.3 μm, purity of 99.9%) and an $Sc_2O_3$ powder (average particle size of 0.3 μm, purity of 99.9%) was further mixed in a prescribed ratio, or at least one selected from an $Sc_2O_3$ powder (average particle size of 0.3 μm, purity of 99.9%) and a $Ga_2O_3$ powder (average particle size of 0.3 μm, purity of 99.9%) was further mixed in a prescribed ratio at Preparation 3.

For the prepared ceramics composites, various kinds of evaluations were performed in the same manner as in Test 1.

In Tables 3 to 5, test conditions ((1) volume composition) and test results ((2) emission intensity, (4) chromaticity variation) in Test 2 are shown.

TABLE 3

| | Constitution | | | | Effect | | | |
|---|---|---|---|---|---|---|---|---|
| | Matrix phase | Main phosphor phase | Volume ratio of $CeAl_{11}O_{18}$ phase (% by volume) | Thickness (μm) | Emission intensity | Chromaticity variation (ΔCEX) | Average value of emission intensity | Average value of chromatic variation |
| Comparative Example 31 | $Al_2O_3$ | $Y_{1.5}Gd_{1.5}Al_5O_{12}$:Ce | 2.2 | 0.08 | 111 | 0.0017 | 113.6 | 0.00223 |
| Comparative Example 32 | $Al_2O_3$ | $Y_{0.5}Gd_{2.5}Al_5O_{12}$:Ce | 2.2 | 0.08 | 112 | 0.0021 | | |
| Comparative Example 33 | $Al_2O_3$ | $Yb_3Al_5O_{12}$:Ce | 2.3 | 0.08 | 114 | 0.0021 | | |
| Comparative Example 34 | $Al_2O_3$ | $Lu_3Al_5O_{12}$:Ce | 2.1 | 0.08 | 125 | 0.0023 | | |
| Comparative Example 35 | $Al_2O_3$ | $Y_3Al_5O_{12}$:Ce | 2.3 | 0.09 | 111 | 0.0015 | | |
| Comparative Example 36 | $Al_2O_3$ | $Tb_3Al_5O_{12}$:Ce | 2.1 | 0.09 | 113 | 0.0015 | | |
| Comparative Example 37 | $Al_2O_3$, $Ga_2O_3$ | $Y_3Ga_1Al_4O_{12}$:Ce | 2.5 | 0.08 | 110 | 0.0025 | | |
| Comparative Example 38 | $Al_2O_3$, $Ga_2O_3$ | $Gd_3Ga_1Al_4O_{12}$:Ce | 2.1 | 0.08 | 112 | 0.0021 | | |
| Comparative Example 39 | $Al_2O_3$, $Ga_2O_3$ | $Tb_3Ga_1Al_4O_{12}$:Ce | 2.5 | 0.08 | 107 | 0.0024 | | |
| Comparative Example 40 | $Al_2O_3$, $Ga_2O_3$ | $Yb_3Ga_1Al_4O_{12}$:Ce | 2.1 | 0.08 | 107 | 0.0027 | | |
| Comparative Example 41 | $Al_2O_3$, $Ga_2O_3$ | $Lu_3Ga_1Al_4O_{12}$:Ce | 2.3 | 0.08 | 108 | 0.0027 | | |
| Comparative Example 42 | $Al_2O_3$, $Sc_2O_3$ | $Y_3Sc_2Al_3O_{12}$:Ce | 2.4 | 0.08 | 121 | 0.0021 | | |
| Comparative Example 43 | $Al_2O_3$, $Sc_2O_3$ | $Y_3Sc_1Al_4O_{12}$:Ce | 2.6 | 0.08 | 116 | 0.0024 | | |
| Comparative Example 44 | $Al_2O_3$, $Sc_2O_3$ | $Lu_3Sc_2Al_3O_{12}$:Ce | 2.7 | 0.08 | 118 | 0.0025 | | |
| Comparative Example 45 | $Al_2O_3$, $Sc_2O_3$ | $Lu_3Sc_1Al_4O_{12}$:Ce | 2.1 | 0.08 | 119 | 0.0029 | | |
| Example 31 | $Al_2O_3$ | $Y_3Al_5O_{12}$:Ce | 2.4 | 0.1 | 110 | 0.0011 | 111.9 | 0.00111 |
| Example 32 | $Al_2O_3$ | $Y_{1.5}Gd_{1.5}Al_5O_{12}$:Ce | 2.3 | 0.1 | 109 | 0.001 | | |
| Example 33 | $Al_2O_3$ | $Y_{0.5}Gd_{2.5}Al_5O_{12}$:Ce | 2.6 | 0.1 | 110 | 0.0009 | | |
| Example 34 | $Al_2O_3$ | $Tb_3Al_5O_{12}$:Ce | 2.3 | 0.1 | 109 | 0.0011 | | |
| Example 35 | $Al_2O_3$ | $Yb_3Al_5O_{12}$:Ce | 2.4 | 0.1 | 110 | 0.0013 | | |
| Example 36 | $Al_2O_3$ | $Lu_3Al_5O_{12}$:Ce | 2.4 | 0.1 | 125 | 0.0013 | | |
| Example 37 | $Al_2O_3$, $Ga_2O_3$ | $Y_3Ga_1Al_4O_{12}$:Ce | 2.3 | 0.1 | 109 | 0.0011 | | |
| Example 38 | $Al_2O_3$, $Ga_2O_3$ | $Gd_3Ga_1Al_4O_{12}$:Ce | 2.1 | 0.1 | 108 | 0.0011 | | |
| Example 39 | $Al_2O_3$, $Ga_2O_3$ | $Tb_3Ga_1Al_4O_{12}$:Ce | 2.7 | 0.1 | 102 | 0.001 | | |
| Example 40 | $Al_2O_3$, $Ga_2O_3$ | $Yb_3Ga_1Al_4O_{12}$:Ce | 2.7 | 0.1 | 104 | 0.0012 | | |
| Example 41 | $Al_2O_3$, $Ga_2O_3$ | $Lu_3Ga_1Al_4O_{12}$:Ce | 2.1 | 0.1 | 105 | 0.0011 | | |
| Example 42 | $Al_2O_3$, $Sc_2O_3$ | $Y_3Sc_2Al_3O_{12}$:Ce | 2.6 | 0.1 | 120 | 0.0012 | | |
| Example 43 | $Al_2O_3$, $Sc_2O_3$ | $Y_3Sc_1Al_4O_{12}$:Ce | 2.1 | 0.1 | 121 | 0.001 | | |
| Example 44 | $Al_2O_3$, $Sc_2O_3$ | $Lu_3Sc_2Al_3O_{12}$:Ce | 2.3 | 0.1 | 119 | 0.0011 | | |
| Example 45 | $Al_2O_3$, $Sc_2O_3$ | $Lu_3Sc_1Al_4O_{12}$:Ce | 2.1 | 0.1 | 118 | 0.0012 | | |

TABLE 4

| | Constitution | | | | Effect | | | |
|---|---|---|---|---|---|---|---|---|
| | Matrix phase | Main phosphor phase | Volume ratio of $CeAl_{11}O_{18}$ phase (% by volume) | Thickness (μm) | Emission intensity | Chromaticity variation (ΔCEX) | Average value of emission intensity | Average value of chromatic variation |
| Example 46 | $Al_2O_3$ | $Y_3Al_5O_{12}$:Ce | 4.2 | 1 | 102 | 0.001 | 102.4 | 0.00080 |
| Example 47 | $Al_2O_3$ | $Y_{1.5}Gd_{1.5}Al_5O_{12}$:Ce | 4.1 | 1 | 102 | 0.0009 | | |
| Example 48 | $Al_2O_3$ | $Y_{0.5}Gd_{2.5}Al_5O_{12}$:Ce | 3.9 | 1 | 104 | 0.0007 | | |
| Example 49 | $Al_2O_3$ | $Tb_3Al_5O_{12}$:Ce | 3.9 | 1 | 102 | 0.0006 | | |
| Example 50 | $Al_2O_3$ | $Yb_3Al_5O_{12}$:Ce | 3.9 | 1 | 105 | 0.0007 | | |
| Example 51 | $Al_2O_3$ | $Lu_3Al_5O_{12}$:Ce | 3.8 | 1 | 101 | 0.0005 | | |
| Example 52 | $Al_2O_3, Ga_2O_3$ | $Y_3Ga_1Al_4O_{12}$:Ce | 3.9 | 1 | 101 | 0.0008 | | |
| Example 53 | $Al_2O_3, Ga_2O_3$ | $Gd_3Ga_1Al_4O_{12}$:Ce | 4.2 | 1 | 103 | 0.0006 | | |
| Example 54 | $Al_2O_3, Ga_2O_3$ | $Tb_3Ga_1Al_4O_{12}$:Ce | 4.1 | 1 | 102 | 0.0009 | | |
| Example 55 | $Al_2O_3, Ga_2O_3$ | $Yb_3Ga_1Al_4O_{12}$:Ce | 4.2 | 1 | 105 | 0.0008 | | |
| Example 56 | $Al_2O_3, Ga_2O_3$ | $Lu_3Ga_1Al_4O_{12}$:Ce | 4.3 | 1 | 102 | 0.0007 | | |
| Example 57 | $Al_2O_3, Sc_2O_3$ | $Y_3Sc_2Al_3O_{12}$:Ce | 4.1 | 1 | 101 | 0.001 | | |
| Example 58 | $Al_2O_3, Sc_2O_3$ | $Y_3Sc_1Al_4O_{12}$:Ce | 4.1 | 1 | 102 | 0.001 | | |
| Example 59 | $Al_2O_3, Sc_2O_3$ | $Lu_3Sc_2Al_3O_{12}$:Ce | 4 | 1 | 103 | 0.0008 | | |
| Example 60 | $Al_2O_3, Sc_2O_3$ | $Lu_3Sc_1Al_4O_{12}$:Ce | 3.9 | 1 | 101 | 0.001 | | |
| Example 61 | $Al_2O_3$ | $Y_{0.5}Gd_{2.5}Al_5O_{12}$:Ce | 4.8 | 1.1 | 106 | 0.0009 | 103.9 | 0.00068 |
| Example 62 | $Al_2O_3, Sc_2O$ | $Lu_3Sc_2Al_3O_{12}$:Ce | 4.9 | 1.1 | 103 | 0.0006 | | |
| Example 63 | $Al_2O_3$ | $Y_3Al_5O_{12}$:Ce | 4.7 | 1.2 | 102 | 0.0009 | | |
| Example 64 | $Al_2O_3, Ga_2O_3$ | $Y_3Ga_1Al_4O_{12}$:Ce | 4.2 | 1.2 | 102 | 0.0006 | | |
| Example 65 | $Al_2O_3, Ga_2O_3$ | $Tb_3Ga_1Al_4O_{12}$:Ce | 4.8 | 1.2 | 107 | 0.0007 | | |
| Example 66 | $Al_2O_3, Sc_2O_3$ | $Y_3Sc_2Al_3O_{12}$:Ce | 4.3 | 1.2 | 107 | 0.0008 | | |
| Example 67 | $Al_2O_3$ | $Y_{1.5}Gd_{1.5}Al_5O_{12}$:Ce | 4.7 | 1.3 | 104 | 0.001 | | |
| Example 68 | $Al_2O_3, Ga_2O_3$ | $Yb_3Ga_1Al_4O_{12}$:Ce | 4.9 | 1.3 | 102 | 0.0004 | | |
| Example 69 | $Al_2O_3, Sc_2O_3$ | $Y_3Sc_1Al_4O_{12}$:Ce | 4.2 | 1.3 | 104 | 0.0006 | | |
| Example 70 | $Al_2O_3$ | $Lu_3Al_5O_{12}$:Ce | 4.9 | 1.4 | 106 | 0.0007 | | |
| Example 71 | $Al_2O_3, Sc_2O_3$ | $Lu_3Sc_1Al_4O_{12}$:Ce | 4.9 | 1.4 | 106 | 0.0009 | | |
| Example 72 | $Al_2O_3$ | $Tb_3Al_5O_{12}$:Ce | 4.6 | 1.5 | 102 | 0.0005 | | |
| Example 73 | $Al_2O_3$ | $Yb_3Al_5O_{12}$:Ce | 4.8 | 1.6 | 101 | 0.0006 | | |
| Example 74 | $Al_2O_3, Ga_2O_3$ | $Gd_3Ga_1Al_4O_{12}$:Ce | 4.7 | 1.7 | 104 | 0.0005 | | |
| Example 75 | $Al_2O_3, Ga_2O_3$ | $Lu_3Ga_1Al_4O_{12}$:Ce | 4.6 | 1.9 | 103 | 0.0005 | | |

TABLE 5

| | Constitution | | | | Effect | | | |
|---|---|---|---|---|---|---|---|---|
| | Matrix phase | Main phosphor phase | Volume ratio of $CeAl_{11}O_{18}$ phase (% by volume) | Thickness (μm) | Emission intensity | Chromaticity variation (ΔCEX) | Average value of emission intensity | Average value of chromatic variation |
| Comparative Example 46 | $Al_2O_3$ | $Y_{0.5}Gd_{2.5}Al_5O_{12}$:Ce | 5.5 | 2.0 | 96 | 0.0003 | 93.5 | 0.00055 |
| Comparative Example 47 | $Al_2O_3, Sc_2O_3$ | $Lu_3Sc_2Al_3O_{12}$:Ce | 5.8 | 2.5 | 92 | 0.0007 | | |
| Comparative Example 48 | $Al_2O_3$ | $Y_3Al_5O_{12}$:Ce | 5.3 | 2.3 | 91 | 0.0002 | | |
| Comparative Example 49 | $Al_2O_3, Ga_2O_3$ | $Y_3Ga_1Al_4O_{12}$:Ce | 5.4 | 2.2 | 96 | 0.0005 | | |
| Comparative Example 50 | $Al_2O_3, Ga_2O_3$ | $Tb_3Ga_1Al_4O_{12}$:Ce | 6.1 | 2.6 | 94 | 0.0005 | | |
| Comparative Example 51 | $Al_2O_3, Sc_2O_3$ | $Y_3Sc_2Al_3O_{12}$:Ce | 5.3 | 2.3 | 96 | 0.0009 | | |
| Comparative Example 52 | $Al_2O_3$ | $Y_{1.5}Gd_{1.5}Al_5O_{12}$:Ce | 5.5 | 2.6 | 92 | 0.0008 | | |
| Comparative Example 53 | $Al_2O_3, Ga_2O_3$ | $Yb_3Ga_1Al_4O_{12}$:Ce | 5.2 | 2.3 | 93 | 0.0005 | | |
| Comparative Example 54 | $Al_2O_3, Sc_2O_3$ | $Y_3Sc_1Al_4O_{12}$:Ce | 5.7 | 2.1 | 96 | 0.0003 | | |
| Comparative Example 55 | $Al_2O_3$ | $Lu_3Al_5O_{12}$:Ce | 5.2 | 2.1 | 97 | 0.0006 | | |
| Comparative Example 56 | $Al_2O_3, Sc_2O_3$ | $Lu_3Sc_1Al_4O_{12}$:Ce | 5.1 | 2.7 | 91 | 0.0008 | | |
| Comparative Example 57 | $Al_2O_3$ | $Tb_3Al_5O_{12}$:Ce | 5.8 | 2.5 | 90 | 0.0005 | | |
| Comparative Example 58 | $Al_2O_3$ | $Yb_3Al_5O_{12}$:Ce | 5.8 | 2.4 | 95 | 0.0002 | | |
| Comparative Example 59 | $Al_2O_3, Ga_2O_3$ | $Gd_3Ga_1Al_4O_{12}$:Ce | 5.2 | 2.2 | 92 | 0.0007 | | |
| Comparative Example 60 | $Al_2O_3, Ga_2O_3$ | $Lu_3Ga_1Al_4O_{12}$:Ce | 5.4 | 2.1 | 91 | 0.0008 | | |

Incidentally, in (1) volume composition, as a result of calculating the volume ratio of $Y_3Al_5O_{12}$:Ce that is a main phosphor phase, the volume ratio of $Al_2O_3$ that is a matrix phase, and the volume ratio of the $CeAl_{11}O_{18}$ phase in the ceramics composite, it was confirmed that the main phosphor phase is mixed in 20% by volume to 25% by volume and the $CeAl_{11}O_{18}$ phase is mixed only in the main phosphor phase and is present at higher density in prescribed thickness at an outer peripheral part than at an inner part of the main phosphor phase.

As shown in Table 2, it is recognized that the chromaticity variation ($\Delta CIE_x$) becomes twice or more times worse in the case where the prescribed thickness of the $CeAl_{11}O_{18}$ phase is less than 0.1 mm (Comparative Examples 31 to 45) than in the case where the thickness is 0.1 mm or more (Examples 31 to 75).

Moreover, it is recognized that the chromaticity variation ($\Delta CIE_x$) is improved in the case where the $CeAl_{11}O_{18}$ phase is present at higher density with a prescribed thickness at an outer peripheral part than at an inner part of the main phosphor phase (Examples 31 to 75) as compared with the case where the phase is mixed in the matrix phase and the main phosphor phase (Examples 1 to 30).

Furthermore, in the case where the prescribed thickness of the $CeAl_{11}O_{18}$ phase is larger than 1.9 mm (Comparative Examples 46 to 60), it is recognized that the emission intensity tends to decrease.

Incidentally, with regard to (3) color unevenness, as compared with a commercially available YAG:Ce phosphor (P46-Y3 manufactured by Chemical Optronics), it is recognized that the color unevenness is small under every condition. Moreover, with regard to (5) heat conductivity, as a result of evaluation targeting 18 W/(m·K) or more from the viewpoint of a heat radiation effect, it is recognized that the heat conductivity is as high as 24 W/(m·K) under every condition.

For the ceramics composites in Examples 31 to 75, when the linear transmittance at 600 nm was regulated so as to be ±0.2% or less, the chromaticity variation ($\Delta CIE_x$) was 0.001 or less in every case and thus the chromaticity variation could be further suppressed.

From the aforementioned evaluation results, it is recognized that the ceramics composites according to the invention are suitable as phosphors to be used together with blue LED in white LED since the chromaticity variation is suppressed by the $CeAl_{11}O_{18}$ phase, the emission intensity of the required yellow fluorescence is high, and the heat conductivity is also high.

While the invention has been described in detail with reference to specific embodiments thereof, it will be apparent to one skilled in the art that various changes and modifications can be made therein without departing from the spirit and scope thereof.

Incidentally, the present application is based on Japanese Patent Applications No. 2012-081007 filed on Mar. 30, 2012 and No. 2012-211637 filed on Sep. 26, 2012, and the contents are incorporated herein by reference.

All references cited herein are incorporated by reference herein in their entirety.

Also, all the references cited herein are incorporated as a whole.

DESCRIPTION OF REFERENCE NUMERALS AND SIGNS

1 Ceramics composite
2 Matrix phase
3 Main phosphor phase
4 $CeAl_{11}O_{18}$ phase

What is claimed is:

1. A ceramics composite comprising:
a fired body comprising:
a matrix phase comprising $Al_2O_3$ or a substance in which one selected from $Sc_2O_3$ and $Ga_2O_3$ is incorporated into $Al_2O_3$;
a main phosphor phase formed in the matrix phase and comprising a substance represented by a general formula $A_3B_5O_{12}$:Ce in which A is at least one selected from Y, Gd, Tb, Yb and Lu, and B is at least one selected from Al, Ga and Sc; and
a $CeAl_{11}O_{18}$ phase mixed in the matrix phase and the main phosphor phase,
wherein the main phosphor phase is included in an amount of 20% by volume to 25% by volume in a total volume of the ceramics composite, and
wherein the $CeAl_{11}O_{18}$ phase is included in an amount of 0.5% by volume to 5.0% by volume in a total volume of the ceramics composite.

2. A ceramics composite comprising:
a matrix phase comprising $Al_2O_3$ or a substance in which one selected from $Sc_2O_3$ and $Ga_2O_3$ is incorporated into $Al_2O_3$;
a main phosphor phase formed in the matrix phase and comprising a substance represented by a general formula $A_3B_5O_{12}$:Ce in which A is at least one selected from Y, Gd, Tb, Yb and Lu, and B is at least one selected from Al, Ga and Sc; and
a $CeAl_{11}O_{18}$ phase which is mixed only in the main phosphor phase and is present in higher density with a prescribed thickness at an outer peripheral part than at an inner part of the main phosphor phase and which is contained in an amount of 0.5 to 5.0% by volume in a total volume of the ceramics composite.

3. The ceramics composite according to claim 2, wherein the prescribed thickness of the $CeAl_{11}O_{18}$ phase is 0.1 to 1.9 μm.

4. The ceramics composite according to claim 1, wherein the ceramics composite includes a linear transmittance at 600 nm of 0.5% or more and less than 5.0%.

5. A ceramics composite comprising:
a fired body comprising:
a matrix phase comprising $Al_2O_3$;
a main phosphor phase formed in the matrix phase and comprising a substance represented by a general formula $A_3B_5O_{12}$:Ce, where A comprises at least one member selected from the group consisting of Y, Gd, Tb, Yb and Lu, and B comprises at least one member selected from the group consisting of Al, Ga and Sc, the main phosphor phase being included in an amount of 20% by volume to 25% by volume in a total volume of the ceramics composite; and
a $CeAl_{11}O_{18}$ phase formed in the matrix phase and the main phosphor phase, the $CeAl_{11}O_{18}$ phase being included in an amount of 0.5% by volume to 5.0% by volume in a total volume of the ceramics composite.

6. The ceramics composite according to claim 5, wherein the matrix phase further comprises at least one member selected from the group consisting of $Sc_2O_3$ and $Ga_2O_3$, which is incorporated into the $Al_2O_3$.

7. The ceramics composite according to claim 5, wherein the ceramics composite includes a linear transmittance at 600 nm of 0.5% or more and less than 5.0%.

* * * * *